United States Patent [19]

Shiokawa et al.

[11] 4,126,800
[45] Nov. 21, 1978

[54] SURFACE ELASTIC WAVE DEVICE USING SIDE LOBES

[75] Inventors: Showko Shiokawa, Yokohama; Takaaki Kusakabe, Tokyo; Toyosaka Moriizumi, Tokyo; Tsutomu Yasuda, Tokyo, all of Japan

[73] Assignee: Toko, Inc., Tokyo, Japan

[21] Appl. No.: 800,627

[22] Filed: May 25, 1977

[30] Foreign Application Priority Data

Sep. 30, 1976 [JP] Japan .................................. 51-117738
Sep. 30, 1976 [JP] Japan ............................ 51-131746[U]
Sep. 30, 1976 [JP] Japan ............................ 51-131747[U]

[51] Int. Cl.² ........................................... H01L 41/10
[52] U.S. Cl. ...................................... 310/313; 333/72
[58] Field of Search ................ 310/313; 333/30 R, 72

[56] References Cited

U.S. PATENT DOCUMENTS

| 3,550,045 | 12/1970 | Adler | 333/30 R X |
|---|---|---|---|
| 3,551,837 | 12/1970 | Speiser et al. | 310/313 X |
| 3,582,540 | 6/1971 | Adler | 333/30 R X |
| 3,600,710 | 8/1971 | Adler | 357/26 X |
| 3,621,482 | 11/1971 | Adler | 333/30 R X |
| 3,626,309 | 12/1971 | Knowles | 333/30 R X |
| 3,723,916 | 3/1973 | Speiser et al. | 310/313 X |
| 3,810,257 | 5/1974 | Jones et al. | 333/30 R |

Primary Examiner—Mark O. Budd

[57] ABSTRACT

A surface elastic wave device including input and output transducer means provided on a base plate of a piezoelectric material, wherein the input transducer means or output transducer means or both comprise a plurality of comb-like electrodes each including an equal number of pairs of interdigital electrodes, and the comb-like electrodes are arranged in parallel with each other with a predetermined spacing therebetween in the longitudinal direction of the interdigital fingers and with a predetermined width. Some of the comb-like electrodes may be differentiated from the remaining ones in respect of the spacing in the longitudinal direction of the interdigital fingers, the width, the number of interdigital finger pairs and/or the overlapping length of the interdigital fingers.

6 Claims, 5 Drawing Figures

SURFACE ELASTIC WAVE DEVICE USING SIDE LOBES

This invention relates to a surface elastic wave device, and more particularly it pertains to such a device having an improved frequency characteristic and utilizable as a filter.

It is the recent trend that in various fields, use is being made of surface elastic wave devices adapted for effecting electric-mechanical and mechanical-electric conversions wherein an input electric signal is converted into surface elastic wave by input side interdigital-finger comb-like electrode means provided on a piezoelectric base plate and then the surface elastic wave is converted into an electric signal by output side interdigital-finger comb-like electrode means after having propagated along a path in the piezoelectric base plate. Such devices can be employed as filters, delay lines and so forth to achieve desired frequency characteristics and delay characteristics, and are advantageous in that they can be produced by making use of integrated circuit techniques and require no adjustment.

In surface elastic wave devices of the foregoing type, the wavelength, or the center frequency of the surface elastic wave produced therein is determined in dependence on the spacing between adjacent ones of the interdigital fingers of each comb-like electrode used therein, and the surface elastic wave having the wavelength thus determined is caused to propagate in a direction perpendicular to the longitudinal direction of the interdigital fingers. In such a case, however, the wavelength of the excited surface elastic wave is not necessarily constant but falls within a predetermined band; thus, the frequency characteristic of such a surface elastic wave device also has a predetermined band in the vicinity of the center frequency which depends on the spacing or interval between the interdigital fingers. In case such a device is used as a filter or the like, it is required that a predetermined characteristic be realized in respect of frequency band, selectivity and so forth.

In order to improve the frequency characteristics of surface elastic wave devices, various attempts have heretofore been made with respect to the electrode construction and configuration of such devices. It has been proposed to improve the characteristics by making so-called weighting, that is, by changing the overlapping length of the interdigital fingers of each comb-like electrode, but such proposal presents a problem that the design of the electrode pattern becomes complicated so that difficulties are experienced in the manufacture of the devices.

In some cases, there is a demand for such a device that surface elastic waves of different frequencies are excited and then only a signal having a predetermined frequency is taken out of the thus excited surface elastic waves. To meet such a demand, it has conventionally been the practice either to provide a plurality of comb-like electrodes at the input side to excite surface elastic waves of different frequencies or provide a plurality of output side electrodes each adapted to respond to surface elastic wave of different frequency. Even when plural electrodes are provided as mentioned above, however, difficulty is encountered in an attempt to take out a predetermined particular frequency since the surface elastic waves are transmitted and received with a predetermined band width. In order to make the band width narrower, it is necessary to increase the number of interdigital finger pairs of each comb-link electrode. As mentioned above, the conventional device constituting a filter is disadvantageous in that the construction and electrode configuration thereof are complicated.

Accordingly, it is an object of this invention to provide a surface elastic wave device which is free from the aforementioned drawbacks of the prior art, makes it possible to achieve desired frequency characteristics with simplified construction, is easy to design and can filter out a predetermined particular frequency to be taken out to be used or eliminated.

In the prior-art surface elastic wave device, a single wave source or input electrode has been used and it has been attempted to improve the characteristics by means of the configuration of such a single electrode alone, while in the surface elastic wave device according to this invention, cyclic nature is imparted to the distribution of excitation by wave sources, thereby improve the characteristics thereof.

In the process of making this invention, the inventors have carried out observations concerning variations with frequency in propagation pattern of surface elastic waves and as a result recognized that when an input electric signal is applied to interdigital-finger comb-like electrode to excite surface elastic wave, the resultant wave propagates in a direction perpendicular to the longitudinal direction of the interdigital fingers and that at the same time, surface elastic wave having a different propagation direction is excited out of the end of the comb-like electrode. It has also been found that the surface elastic wave excited out of the end of the comb-like electrode has a frequency different from the center frequency which depends on the spacing between the interdigital fingers of the comb-like electrode.

It is considered that the phenomenon mentioned above occurs for the following reason: When surface elastic wave is excited by a comb-like electrode, the propagation direction of such a wave is determined by a component perpendicular to the longitudinal direction of the interdigital fingers constituting the comb-like electrode and a component parallel with the longitudinal direction of the interdigital fingers. In the case of an ordinary comb-like electrode, most of the surface elastic waves produced thereby are permitted to propagate perpendicularly with respect to the longitudinal direction of the interdigital fingers since the perpendicular component is dominant, but at the end of the electrode, the parallel component occurs predominantly so that the surface elastic wave produced thereat is caused to propagate in a different direction.

Thus combining the perpendicular and parallel components, it is possible to cause surface elastic wave of a desired frequency to be propagated in a direction with a predetermined angle to the direction perpendicular to the longitudinal direction of the interdigital fingers. In view of this, the inventors have thought out a surface elastic wave device wherein instead of employing a single wave source as is the case with the prior art, a plurality of comb-like electrodes having a common main lead portion and interdigital fingers are arranged in parallel with each other in the longitudinal direction of the interdigital fingers and the spacing between the comb-like electrodes is made equal as a whole or partially, thereby constituting wave sources, whereby it is possible to set up the proportion between the perpendicular and parallel components as desired. According to this invention, by a cyclic arrangement of the comb-like electrodes in the longitudinal direction of the interdigital fingers, surface elastic waves produced at the respective portions of the comb-like electrodes are strengthened together or amplified as to be utilized.

Other objects, features and advantages of this invention will become apparent from the following description taken in conjunction with the accompanying drawings.

Figure 1:
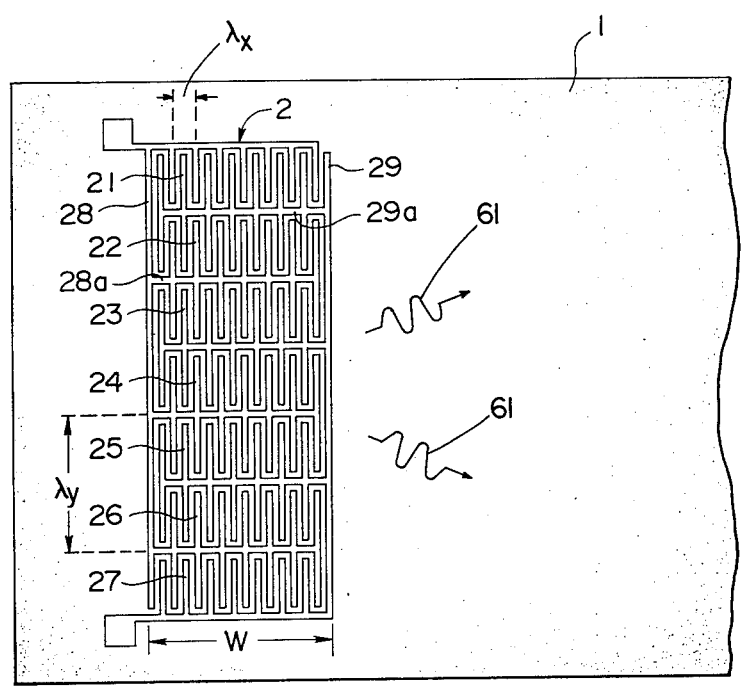
FIG. 1 is a fragmentary top plan view showing an embodiment of this invention.

Referring to FIG. 1, there is shown, in a fragmentary top plan view, an example of the surface elastic wave device according to this invention which includes transducers provided on a base plate 1 of a piezoelectric material, one of such transducers being generally indicated at 2. The transducer 2 includes interdigital comb-like electrodes 21 to 27 each comprising interdigital fingers. In the drawing, seven such electrodes are shown, but this is just for the sake of convenience, and this invention is by no means limited thereto. To electrodes 21 to 27 are provided in parallel with each other while being spaced apart from each other in the longitudinal direction of their interdigital fingers and arranged so that lengths over which the interdigital fingers overlap each other are equal and the spacings between the electrodes are also equal. In this case, the spacings between the interdigital fingers of the electrodes 21 to 27 are determined depending on the desired center frequency.

The transducer 2 includes two main lead portions 28 and 29, one or more sub lead portions 28a and 29a connected to the main lead portions, and electrode fingers connected in the form of branches to the sub lead portions, the main lead portions and electrode fingers being arranged in an interdigital manner, whereby the plurality of interdigital comb-like electrodes 21 to 27 are constructed so that the single transducer 2 is divided. The spacings between the respective comb-like electrodes are made equal as a whole, and such electrodes are arranged so as to represent the same cyclic characteristic. Surface elastic wave is excited at portions where the interdigital fingers of the respective electrodes 21 to 27 but not at the remaining portions. The comb-like electrodes 21 to 27 have an equal width W so as to represent an identical frequency response.

When an input electric signal is AC-wise applied to the transducer 2, a plurality of surface elastic waves are excited out of the interdigital comb-like electrodes 21 to 27 each serving as a wave source. With the FIG. 1 arrangement of the interdigital comb-like electrodes 21 to 27, those ones of the interdigital fingers which are at an equal potential when the input signal is applied are aligned with each other, due to the fact that such interdigital fingers are connected to the same main lead portion, so that the surface elastic waves excited at the respective portions are in phase with each other. Thus, the surface elastic waves whose center frequency depends on the spacing between the interdigital fingers are in phase with each other, so that such surface elastic waves are strengthened or amplified and permitted to propagate in a direction perpendicular to the longitudinal direction of the interdigital fingers.

In such a device, surface elastic waves having a frequency different from the center frequency depending on the spacing between the interdigital fingers of the electrodes 21 to 27 propagate at a predetermined angle with respect to the propagating direction of the surface elastic waves having the aforementioned center frequency. Such surface elastic waves are ones which are excited out of the comb-like electrodes 21 to 27 respectively due to the cyclic characteristic of the transducer 2 which is realized by the fact that the transducer is constituted by the electrodes 21 to 27 as mentioned above. This is due to the fact that the components of the surface elastic waves which are parallel to the longitudinal direction of the interdigital fingers are intensified at a predetermined frequency due to the cyclic nature of the wave sources so that the surface elastic waves of the same frequency coming out of the respective portions strengthen each other.

Figure 2:
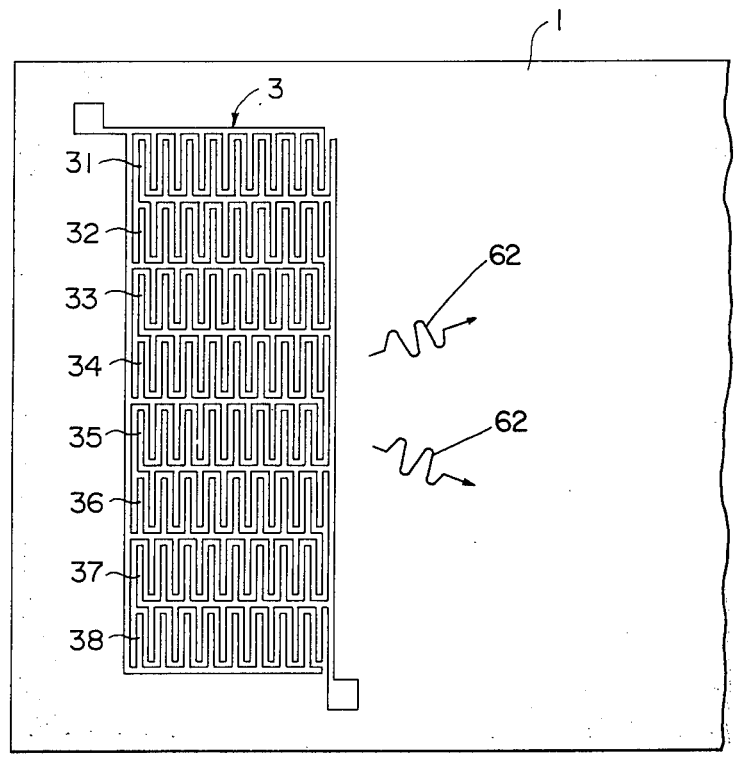
FIG. 2 is a fragmentary top plan view showing another embodiment of this invention.

FIG. 2 shows another example of the surface elastic wave device according to this invention, wherein transducers, one of which is shown at 3, are provided on a base plate 1 of a piezoelectric material. The transducer 3 comprises a plurality of interdigital comb-like electrodes 31 to 38 which are arranged so that equi-potential interdigital fingers are shifted from each other by a half of the wavelength corresponding to the center frequency of the surface elastic wave which can be derived from each comb-like electrode, so that the electrodes 31, 33, 35 and 37 are in reverse phase with the electrodes 32, 34, 36 and 38. With such an electrode arrangement, surface elastic waves corresponding to the center frequency depending on the spacing between the interdigital fingers of the respective comb-like electrodes are cancelled each other so that they do not appear in the output signal of the present device; thus only surface elastic waves indicated at 62 having a frequency different from the center frequency and propagating in a different direction are permitted to appear.

Figure 3:
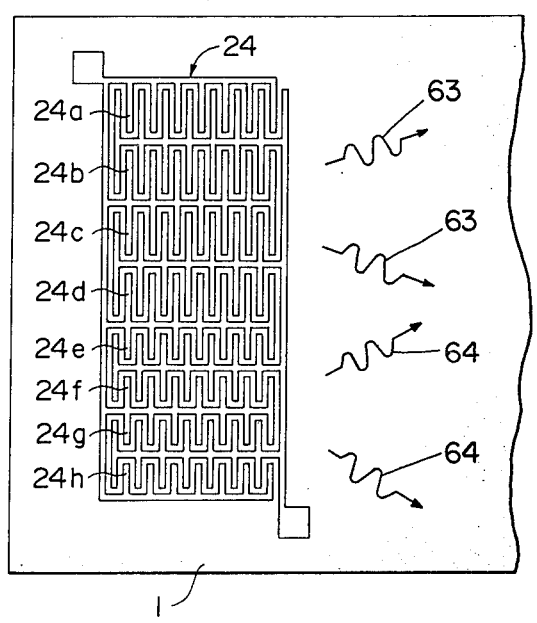
FIG. 3 is a fragmentary top plan view showing still another embodiment of this invention.

FIG. 3 is a fragmentary top plan view showing a still further embodiment of this invention, wherein interdigital comb-like electrodes 24a to 24h are arranged on a base plate 1 of a piezoelectric material and the spacing in the longitudinal direction of the interdigital fingers and width of the electrodes 24a to 24d are made different from those of the electrodes 24e to 24h so that the electrodes 24a to 24d are made to be different in cycle from the electrodes 24e to 24h.

Though the center frequency of this embodiment remains unchanged, surface elastic waves 63 propagating at a predetermined angle from the electrodes 24a to 24d become different in frequency and propagating direction from surface elastic waves 64 propagating at a predetermined angle from the electrodes 24e to 24h.

The changes in cycle are not restricted to the example shown in FIG. 3; that is, more than three different types of changes in cycle may be employed, and other modifications may also be utilized wherein the number of pairs of interdigital fingers is changed, the length over which the interdigital fingers overlap each other is changed, and so on. It is also possible that the center frequency may differ from one comb-like electrode to another. According to this embodiment, it is possible to produce surface elastic waves each having a different frequency and propagating in a different direction.

Figure 4:
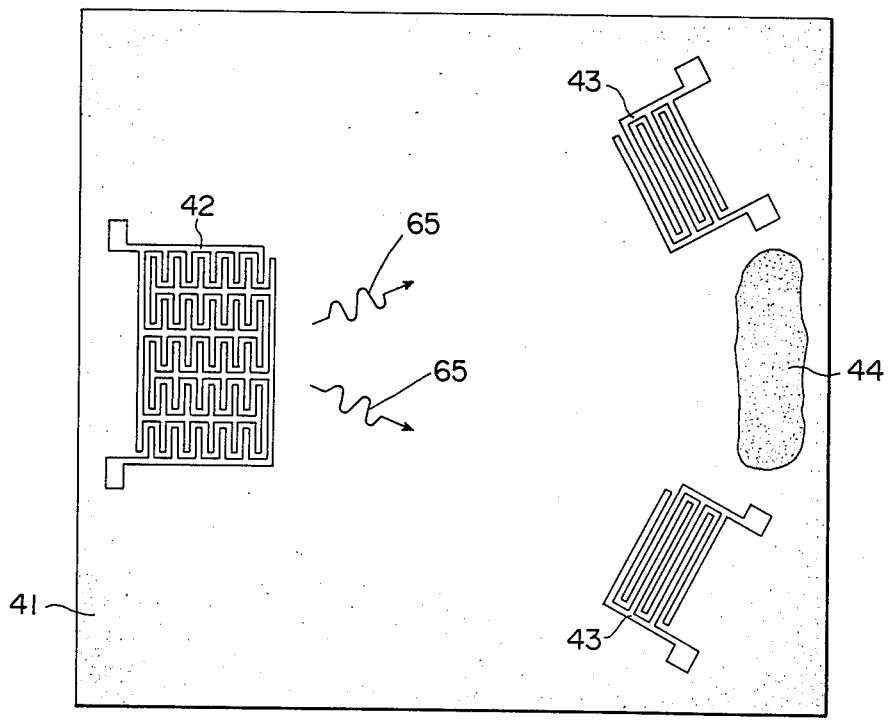
FIGS. 4 and 5 are top plan view showing filters embodying this invention respectively.

FIG. 4 is a top plan view showing an example of the surface elastic wave filter according to this invention, wherein an input transducer 42 is provided on a base plate 41 of an insulating material, the input transducers comprising interdigital finger, comb-like electrodes 42 divided in parallel with each other such as described hereinbefore in connection with FIG. 1. On the base plate 41, there are also provided output transducers 43 in the paths along which surface elastic waves 65 have a frequency different from the center frequency of the input transducer 42. The frequency and propagating direction of each of such surface elastic waves 65 are predetermined depending on the cycle and so forth of the input transducer. An absorber material 44 may be provided in the path for unwanted surface elastic waves to absorb such unwanted waves. With such an arrangement of the transducers, only the surface elastic waves having a predetermined frequency are permitted to propagate toward the output transducers 43; thus, it is possible to obtain a filter having a narrow pass-band and high selectivity.

Figure 5:
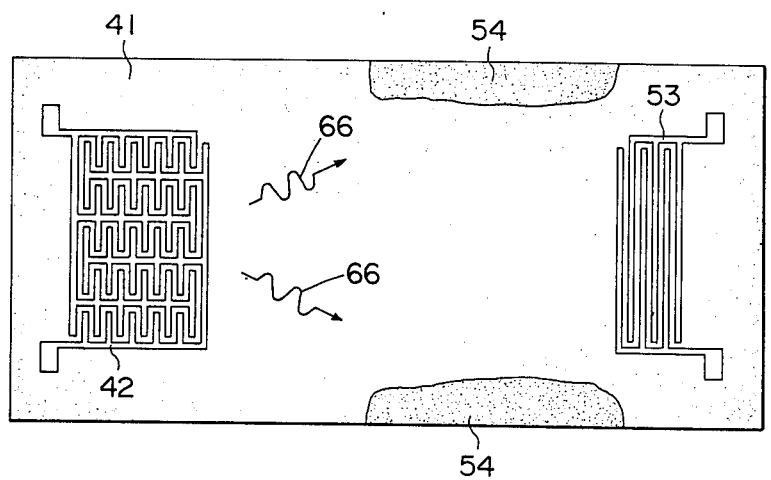

FIG. 5 is a top plan view showing another example of the filter embodying this invention, which is similar to that shown in FIG. 4, except that an output transducer 53 is provided in the path along which surface elastic waves having a frequency corresponding to the center frequency propagate, and absorbers 54 are provided in the paths along which surface elastic waves 66 each having a frequency different from the center frequency propagate respectively. According to this embodiment, a filter can be obtained which is capable of damping a predetermined frequency or frequencies.

As will be readily appreciated from what has been described, the arrangements shown in FIGS. 4 and 5 may be combined so that the output transducers may pick up surface elastic waves of the center frequency propagating in a direction perpendicular to the longitudinal direction of the interdigital fingers and surface elastic waves whose frequency is different from the center frequency. The thus picked-up surface elastic waves may be utilized either in combination or individually.

By making such a design that the frequency of the surface elastic waves which is different from the center frequency falls within the frequency band of the surface elastic waves propagating perpendicularly with respect to the longitudinal direction of the interdigital fingers, it is possible that these surface elastic waves may be easily combined so as to achieve a frequency band characteristic having a trap.

As will be apparent to those skilled in the art, the filter according to this invention is not restricted to the foregoing examples, but various modifications and changes will become possible through use of the electrode construction based on the technical concept of the present invention. Unlike the conventional filters designed so that particular surface elastic waves are taken out to be utilized or eliminated from the surface elastic waves which propagate along the same path, the surface elastic wave filter embodying the present invention is designed such that a different propagating path is provided for surface elastic wave of a different frequency so that surface elastic wave having a predetermined frequency may be taken out to be used or eliminated. According to this invention, therefore, there is provided a filter which is arranged such that deterioration of the characteristics by unwanted signal can be minimized and influence of unwanted reflection wave can be easily avoided. Furthermore, according to this invention, it is possible to achieve any desired characteristic simply by utilizing the electrode arrangement; thus, the filter according to this invention is easy to manufacture and can be miniaturized.

In the surface elastic wave device according to this invention, the center frequency thereof depends on the spacing between the interdigital fingers of each comb-like electrode, whereas the frequency and propagating direction of surface elastic wave different in frequency from the center-frequency wave depend on the spacing between the interdigital fingers and the arrangement of the comb-like electrodes. Thus, by changing the number of the comb-like electrodes and the length over which the interdigital fingers overlap each other, it is possible to cause surface elastic wave having a desired frequency to be propagated in a different direction.

It goes without saying that the number of comb-like electrodes and/or the number of interdigital finger pairs of each electrode may be increased or decreased as desired. The electrode structure which is so divided as to represent cyclic nature may also be employed as an output transducer. The overlapping length of the interdigital fingers and the width of each comb-like electrode may be differentiated as desired.

As will be appreciated from what has been described above, the surface elastic wave device of this invention is capable of filtering surface elastic waves; thus, according to this invention, there is provided a surface elastic wave device capable of taking out a predetermined frequency alone. Furthermore, it is possible to cause surface elastic waves of a predetermined frequency to be propagated in a different direction, depending on the design of the comb-like electrodes serving as cyclic wave sources, thus resulting in the device having a high selectivity.

By utilizing what has been described just above, it is easily possible to damp a signal having a predetermined frequency. This is because only the surface elastic waves having a predetermined frequency can be caused to propagate outside of the propagating path of the remaining surface elastic waves so as to be removed.

In the surface elastic wave device of this invention, its frequency characteristic per se can be varied by imparting cyclic nature to the wave sources thereof. The cyclic nature of the wave sources can be varied depending on the comb-like electrode pattern alone, so that any desired frequency characteristic can be realized through the design of the comb-like electrodes. This leads to an increased degree of freedom in the design of the surface elastic wave device. Moreover, the surface elastic wave device of this invention can be produced easily and at low cost since any desired characteristic can be achieved simply by changing the comb-like electrode pattern.

Although the present invention has been described with respect to some specific embodiments, it is to be understood that the invention is not restricted thereto but covers any and all modifications and changed which may be made within the scope of the appended claims.

What is claimed is:

1. A surface elastic wave device comprising a base plate of a piezo-electric material, input electrode means provided on said base plate for exciting surface elastic wave, and output electrode means provided on said base plate for responding to said surface elastic wave, said input electrode means comprising a plurality of interdigital comb-like electrodes each including an equal number of pairs of interdigital fingers and arranged in parallel with each other with a predetermined spacing therebetween in the longitudinal direction of said interdigital fingers and with a predetermined width, said comb-like electrodes further including a common main lead portion and one or more sub lead portions connected with said main lead portion, said interdigital fingers being attached in the form of branches to said sub lead portions and arranged in interdigital relationship with each other and said main lead portion, whereby a surface elastic wave having a frequency different from the center frequency depending on the spacing between said interdigital fingers is permitted to propagate in a direction from the propagating direction of the surface elastic wave having the center frequency.

2. A surface elastic wave device according to claim 1, wherein equipotential interdigital fingers in said plurality of comb-like electrodes are aligned with each other.

3. A surface elastic wave device according to claim 2 wherein, the equipotential interdigital fingers of adjacent ones of said plurality of comb-like electrodes are shifted from each other by a half of the wavelength corresponding to the center frequency of surface elastic waves produced by the respected comb-like electrodes.

4. A surface elastic wave device according to claim 1, wherein said output electrode means is disposed to receive or eliminate said surface elastic wave, whereby a filter is constituted.

5. A surface elastic wave device comprising a base plate of a piezo-electric material, input electrode means provided on said base plate for exciting surface elastic wave, and output electrode means provided on said base plate for responding to said surface elastic wave, said input electrode means comprising a plurality of sets of comb-like electrodes each including a common main lead portion, one or more sub lead portions connected with said main lead portion and a plurality of pairs of interdigital fingers attached in the form of branches to said sub lead portion and arranged in interdigital relationship with each other and said main lead portion, at least some of said comb-like electrodes being differentiated from the remaining comb-like electrodes in respect of the spacing in the longitudinal direction of the interdigital fingers thereof, the width, the number of the interdigital finger pairs and/or the overlapping length of the interdigital fingers, whereby surface elastic wave having a frequency different from the center frequency of each set of comb-like electrodes which depends on the spacing between said interdigital fingers is permitted to propagate in a direction different from the propagating direction of the surface elastic wave having the center frequency.

6. A surface elastic wave device according to claim 5, wherein said output electrode means is disposed to receive or eliminate said surface elastic wave, whereby a filter is constituted.

* * * * *